United States Patent [19]

Mallon

[11] 4,032,717

[45] June 28, 1977

[54] CIRCUIT ARRANGEMENT FOR A CONTINUOUS ADJUSTMENT OF THE BASE WIDTH IN A STEREO DECODER

[75] Inventor: Dietmar Mallon, Zorneding, Germany

[73] Assignee: Siemens Aktiengesellschaft, Berlin & Munich, Germany

[22] Filed: Feb. 26, 1976

[21] Appl. No.: 661,766

[30] Foreign Application Priority Data

Mar. 13, 1975 Germany .......................... 2511026

[52] U.S. Cl. .......................................... 179/15 BT

[51] Int. Cl.² .......................................... H04H 5/00

[58] Field of Search .................. 179/15 BT; 325/36

[56] References Cited

UNITED STATES PATENTS

| | | | |
|---|---|---|---|
| 3,233,044 | 2/1966 | Hopper | 179/15 BT |
| 3,673,342 | 6/1972 | Muller | 179/15 BT |
| 3,752,934 | 8/1973 | Nakamura et al. | 179/15 BT |
| 3,823,268 | 7/1974 | Modafferi | 179/15 BT |

*Primary Examiner*—Douglas W. Olms
*Attorney, Agent, or Firm*—Hill, Gross, Simpson, Van Santen, Steadman, Chiara & Simpson

[57] ABSTRACT

A circuit arrangement for a continuous adjustment of the base width in a stereo decoder in which a sum signal and a difference signal of two reproduction signals are obtained from a received signal and are converted by way of a matrix operating with sum and difference formation to form the reproduction signals, provides that the matrix input for the different signal is preceded by an attenuator which has a control input for receiving a control voltage and attenuates the difference signal in dependence upon the control voltage. The control voltage is dependent upon the strength of the received signal so that the difference signal component in the reproduction signals is reduced with decreasing strength of the received signal.

5 Claims, 2 Drawing Figures

CIRCUIT ARRANGEMENT FOR A CONTINUOUS ADJUSTMENT OF THE BASE WIDTH IN A STEREO DECODER

BACKGROUND OF THE INVENTION

1. Field of the Invention

This invention relates to a circuit arrangement for continuously adjusting the base width in a stereo decoder in which a sum signal and a difference signal of two reproduction signals are obtained from a received signal and are converted in a matrix by sum and difference formation to form the reproduction signals, and more particularly to such a circuit arrangement in which attenuation is controlled in the difference signal channel depending on the strength of the received signal.

2. Description of the Prior Art

The frequency-modulated stereo-multiplex signal conventionally employed for the transmission of two discrete information channels which, in stereo radio, contain the information from two recording devices for left and right, and accordingly for two reproduction loud speakers on the left and the right, is composed of three components. The first component is a sum signal (L+R) consisting of the left-hand information L and the right-hand information R in the frequency range from 30 Hz to 15 kHz. The second component is a difference signal (L−R) consisting of the left-hand information L and the right-hand information R which is modulated onto a suppressed 38 kHz auxiliary carrier. The frequency band for the difference signal (L−R) extends, from the lower to the upper side band, from 23 kHz to 53 kHz, the frequencies and ranges given herein being exemplary of FM stereo multiplex transmission. A third component serves to transmit a pilot tone of 19 kHz which permits the regeneration of the 38 kHz auxiliary carrier in the stereo decoder. This 38 kHz auxiliary carrier is connected to the pilot tone in a phase-locked fashion. In the stereo decoder, the sum signal (L+R) and the difference signal (L−R) in the original frequency state, i.e. from 30 Hz to 15 kHz are shaped, via the matrix, to form the reproduction signals $U_L$ and $U_R$ which are then fed to the corresponding reproduction devices. The conversion of the difference signal (L−R) from the 38 kHz state into the original frequency state is effected with a synchronous demodulator which is controlled by the regenerated 38 kHz auxiliary carrier. A stereo decoder of this type is compatible with both mono-and stereo-transmissions.

In the case of a mono-transmission, which contains only a sum signal (L+R), the difference signal channel is blocked. The same occurs when, in the case of a stereo-transmission, the receiving field strength is too low for the synchronous demodulator to operate satisfactorily. In these situations only the sum signal channel is transmissive; for this reason, the two reproduction devices both receive the same information. If, on the other hand, the synchronous demodulator supplies a difference signal (L−R) of full signal strength, then, in the ideal situation, both reproduction devices will receive completely separate signals. Then no cross talk occurs from the one channel to the others. In the case of complete channel separation, two corresponding reproduction loud speakers appear, to the person listening thereto, as original sound sources, the sensed distance between which is referred to as base width. The less the channels are separated from one another, i.e. the more one channel produces crosstalk to the other, and the more a loud speaker contains information from the other, then the more the sound sources appear closer together and the base width is smaller. In the extreme case of a mono-transmission, and in the case of a total crosstalk when both loud speakers are reproducing the same information, the base width has reduced to zero; the sound source appears to the listener to lie in the middle between the two actual loud speakers.

If during the reception of a stereo signal, the stereo decoder is switched over from mono to stereo, and vice versa, then, in terms of the reproduction, this appears as a transfer of base width from the value of zero to the maximum value and vice versa. In the case of fluctuating receiving field strengths, in particular in automobile radio receivers, this becomes manifest as a disturbing, constant, hard switch-over between mono and stereo.

SUMMARY OF THE INVENTION

The object of the present invention is to provide a circuit arrangement which aids in avoiding the above mentioned hard switch-over due to fluctuating receiving field strengths, and with which the base width can be continuously adjusted.

For realizing the above object, in a circuit arrangement of the type generally described above, it is proposed that, according to the present invention, the matrix input for the difference signal (L−R) is preceded by an attenuator which has a control input for receiving a control voltage and which attenuates the difference signal (L−R) in dependence upon this control voltage.

It is advantageous that the control voltage for the attenuator should be dependent upon the strength of the received signal in such a manner that the difference signal component in the reproduction signals $U_L$ and $U_R$ reduces with decreasing receiving signal strength.

If a control voltage of this type is not merely taken for the discrete switching on and off of the difference signal path, but is derived from the strength of the received signal, then the reproduction channels will obtain a base width which is adjusted automatically in accordance with the strength of the received signal. Thus, it is possible to constantly mix mono and stereo. Any required switch over from mono to stereo is thus no longer so unpleasantly noticeable to the listener as is the case in the event of a hard switch over.

An advantageous embodiment of a circuit arrangement constructed in accordance with the invention provides that the attenuator comprises two differential amplifiers each having two transistors which are interconnected at their emitters, and between the bases of these transistors the control voltage is connected. Further, the first differential amplifier has its two emitters connected to a source of the difference signal (L−R) and the second differential amplifier is connected, by way of its emitters, to a constant current source. The collectors of one pair of transistors, one from each differential amplifier, are connected to a supply potential and the collectors of the other pair, one from each differential amplifier, form the output for the attenuated difference signal, referenced $b \cdot$ (L−R).

The above described circuit arrangement can advantageously be extended such that the attenuator contains two additional differential amplifiers constructed in the same manner as the others, with a source for the negative difference signal −(L−R), and with an output for the negative, attenuated difference signal $-b \cdot$ (L−R), and that this circuit forms a part of the matrix, so that it is merely necessary to add the sum signal (L+R) at the two outputs in order to form the two reproduction signals.

These embodiments provide a circuit arrangement which is constructed according to the invention and which represents a circuit arrangement which is particularly suitable for integration.

BRIEF DESCRIPTION OF THE DRAWING

Other objects, features and advantages of the invention, its organization, construction and operation will be best understood from the following detailed description taken in conjunction with the accompanying drawing, on which.

DESCRIPTION OF THE PREFERRED EMBODIMENTS

Figure 1:
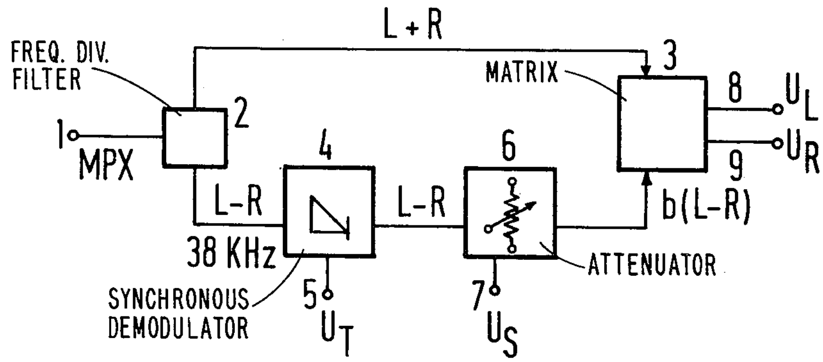
FIG. 1 is a block diagram which illustrates the utilization of a controlled attenuator in the difference signal path of a stereo decoder according to the present invention.

FIG. 1 illustrates a block diagram of a stereo decoder in a simple form in which an input 1 receives an FM stereo multiplex signal MPX. The input 1 is connected to a frequency dividing filter 2 in which the MPX signal is split between the two signal channels for the sum signal (L+R) and for the difference signal (L−R). The sum signal (L+R) passes directly to a matrix 3. The difference signal (L−R) in the 38 kHz state is fed, however, to a synchronous demodulator 4 by means of which it is converted into the normal state with the aid of an auxiliary carrier $U_T$ of 38 kHz which is fed in at an input 5. The auxiliary carrier $U_T$ is derived in a well known manner from the 19 kHz pilot tone (not illustrated). The synchronous demodulator 4 is followed by an attenuator 6 which has not only an output for the attenuated difference signal $b \cdot$ (L−R), $b$ being an attenuation factor, but also a control signal input 7 for receiving a control voltage $U_S$. The attenuated difference signal $b \cdot$ (L−R) is fed to the matrix 3. The matrix 3 possesses two outputs 8 and 9 which carry two reproduction signals $U_L$ and $U_R$.

The above representation has left open the manner in which the signal is split into the sum signal (L+R) and the difference signal (L−R). This can be effected by means of a low pass filter and a band pass filter, or by simply directly conducting the entire MPX signal to the matrix and to the synchronous demodulator. In the second case, the output signals of the matrix each possess components of the other channel in the 38 kHz state, which, however, can easily be filtered out by appropriate low pass filters.

The decoding of the MPX signal to form the reproduction signals $U_L$ and $U_R$ is in accordance with the following matrix equations:

$$U_L = a \cdot (L+R) + b \cdot (L-R) = L \cdot (a+b) + R \cdot (a-b);$$

and $$U_R = a \cdot (L+R) - b \cdot (L-R) = R \cdot (a+b) + L \cdot (a-b).$$

The full stereo effect is attained when $a = b \neq 0$. Then, the cross talk attenuation between the reproduction signals $U_L$ and $U_R$, and thus the bandwidth, is the maximum.

In the present case it has been assumed that $a = 1$ and $b$ is variable between the values $0 \leq b \leq 1$. Thus, independence upon the value of $b$, it is possible to pass through all values between the extreme values of stereo and mono. The difference signal (L−R) is supplied with the factor $b$ by way of attenuator 6. Its value is advantageously a function of the input signal strength and generally of a control voltage $U_S$. Thus, the abovementioned matrix equations obtain the following values:

$$U_L = L \cdot (1+b) + R \cdot (1+b);\text{ and}$$

$$U_R = R \cdot (1+b) + L \cdot (1-b).$$

Figure 2:
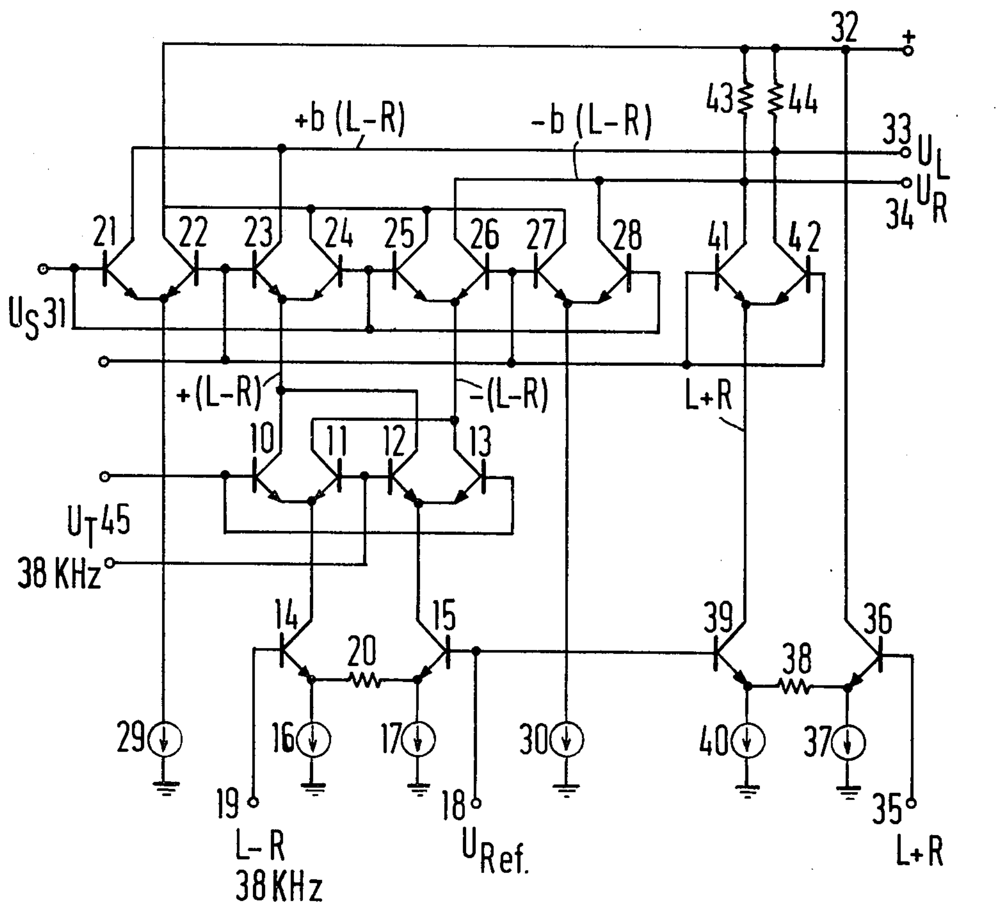
FIG. 2 is a schematic circuit diagram of an exemplary embodiment of a circuit for practicing the invention.

In FIG. 2, a synchronous demodulator is illustrated as comprising four transistors 10, 11, 12 and 13. Here, the emitters of the two transistors 10 and 11 are connected to each other and by way of the collector-emitter path of a transistor 14 and a constant current source 16 to a reference potential, here ground. In addition, the emitters of the two transistors 12 and 13 are interconnected and lead, via the collector-emitter path of the transistor 15 and a constant current source 17 to the reference potential. The base of the transistor 15 is connected to an input 18 to receive a reference voltage $U_{Ref}$, and the base of the transistor 14 is connected to an input 19 for receiving the difference signal (L−R) in the 38 kHz state. The emitters of the two transistors 14 and 15 are connected to each other by way of a resistor 20. An input 45 bearing an auxiliary carrier signal $U_T$ of 38 kHz in each case lies between the bases of the transistors 10 and 11 and the transistors 12 and 13. The collectors of the two transistors 10 and 12 are interconnected and feed a difference signal (L−R) in the original frequency state with a positive sign; the collectors of the transistors 11 and 13 are likewise combined and conduct the difference signal −(L−R) with a negative sign.

The attenuator 6 comprises a plurality of transistors 21–28. Here, the emitters of the two transistors 21 and 22 are interconnected and lead, by way of a constant current source 29, to the reference potential. The emitters of the two transistors 27 and 28 are likewise interconnected and lead to the reference potential by way of a constant current source 30. The emitters of the two transistors 23 and 24 are interconnected and are connected to the interconnected collectors of the transistors 10 and 12 and conduct the positive difference signal (L−R). The emitters of the two transistors 25 and 26 are interconnected and are connected to the interconnected collectors of the transistors 11 and 13 and carry the negative difference signal −(L−R). One of the two terminals of an input 31 for the control voltage $U_S$ is connected to the bases of the transistors 21, 24, 25 and 28, whereas the other terminal of the input 31 is connected to the bases of the transistors 22, 23, 26 and 27. The collectors of the transistors 22, 24, 25 and 27 are connected to a terminal 32 for receiving a supply potential, the collectors of the transistors 21 and 23 are connected to an output 33 for the reproduction signal $U_L$, and the collectors of the two transistors 26 and 28 are connected to an output 34 for the reproduction signal $U_R$.

The exemplary embodiment illustrated in FIG. 2 is extended by circuit components which complete the matrix 3 of the stereo decoder. For this purpose, an input 35 for receiving the sum signal (L+R) is connected to the base of a transistor 36, whose collector is connected to the terminal 32 for receiving the supply potential. The emitter of the transistor 36 is connected by way of constant current source 37 to the reference potential and by way of a resistor 38 to the emitter of a transistor 39. The emitter of the transistor 39 is also connected by way of a constant current source 40 to the reference potential. The collector of the transistor 39 is connected to interconnected emitters of two transistors 41 and 42, whose bases are connected in common with the bases of the transistors 22, 23, 26, 27 and with a terminal of the input 31 for the control voltage $U_S$. The collector of the transistor 41 is connected to the output 34 and by way of a resistor 43 to receive the supply potential, while the collector of the transistor 42 is connected to the output 33 and by way of a resistor 44 to the supply terminal 32.

The polarity and the magnitude of the control voltage $U_S$ determine which transistor in each case in the four pairs of the transistors 21–28 is more conductive than the other. It is thereby also determined which component of the current supplied by the constant current source 29 and of the difference signal with the positive sign +(L−R) supplied by the synchronous demodulator 4 is fed to the output 33 and contributes, by way of the resistor 44, to the output voltage $U_L$, and which component flows directly to the terminal 32. The same applies to the output signal with a negative signal −(L−R) of the synchronous demodulator 4 and to the current supplied by the constant current source 30. The current components each flow either to the output 34 and thus contribute, via the resistor 43, to the output voltage $U_R$, or flow directly to the terminal 32. The sum signal (L+R) is fed via the input 35 to the transistor 36 and is amplified via the transistor 39 which, like the transistor 15, is connected at its base to the input 18 for a reference voltage $U_{Ref}$ and, having been split by the transistors 41 and 42, is connected to the outputs 33 and 34 and, via the resistors 43 and 44 contributes to the output voltages $U_R$ and $U_L$. The two resistors 43 and 44 thus form the summation points of the matrix 4, the sum of the sum signal (L+R) and of the difference signal (L−R) being formed across the resistor 44, and the difference between the sum signal (L+R) and the difference signal (L−R) being formed across the resistor 43.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a stereo decoder of the type in which received multiplex signal is split into a sum signal and a difference signal of two reproduction signals and are fed through a sum signal channel and a difference signal channel, respectively, to respective sum signal and difference signal inputs of a sum and difference matrix which is responsive thereto to form the reproduction signals, the improvement therein comprising:

a circuit arrangement for continuously adjusting the base width including control signal means for deriving a control signal in accordance with the signal strength of the received signal; and attenuator means interposed in the difference signal channel, said attenuator means having a control input connected to said control signal means and operable in response to said control signal to control the attenuation of the difference signal.

2. The improved stereo decoder of claim 1, wherein said attenuator means includes means for reducing the difference signal in response to decreasing strength of the received signal.

3. The improved stereo decoder of claim 1, wherein said attenuator means comprises:

a constant current source;

said control input;

a difference signal input;

an attenuated difference signal output; and first, second, third and fourth transistors each having a base, an emitter and a collector, said first and second transistors and said third and fourth transistors constituting differential amplifiers, said emitters of said first and second transistors connected together and to a reference potential via said constant current source, said emitters of said third and fourth transistors connected together and to said difference signal input, said bases of said transistors connected to said control input for receiving said control signal, said collectors of said first and third transistors connected together and forming said attenuated difference signal output, and said collectors of said second and fourth transistors connected together and to a supply potential.

4. The improved stereo decoder of claim 3, comprising:

a second pair of differential amplifiers including collectors connected in mirror-image to said difference signal output and otherwise constructed in the same configuration as the first-mentioned differential amplifiers, means connected to said difference signal input for providing a negative difference signal, said means connected to one of the differential amplifiers of said second pair of differential amplifiers, said second pair of differential amplifiers including an output for a negative attenuated difference signal, said circuit arrangement thereby forming part of the matrix so that only the addition of the sum signal at said attenuation output is necessary for obtaining the reproduction signals.

5. The improved stereo decoder of claim 1, wherein the difference signal component of the multiplex signal is received modulated on a carrier and the difference signal channel includes a synchronous demodulator which provides a positive signal −(L−R) and a negative difference signal −(L−R), wherein said attenuator means includes first and second attenuation sections for receiving and attenuating the positive and negative difference signals to provide, respectively, an attenuated positive difference signal $+b(L-R)$ and an attenuated negative difference signal $-b(L-R)$ where $b$ is the attenuation factor, L is the left-hand information and R is the right-hand information, and wherein the matrix comprises means for adding the sum signal in the form (L+R) to each of the attenuated difference signals to obtain the two reproduction signals.

* * * * *